United States Patent [19]

Maeda et al.

[11] Patent Number: 4,939,462
[45] Date of Patent: Jul. 3, 1990

[54] METHOD AND APPARATUS FOR MRI

[75] Inventors: Akira Maeda, Machida; Koichi Sano, Sagamihara; Tetsuo Yokoyama, Tokyo; Hideaki Koizumi, Katsuta, all of Japan

[73] Assignee: Hitachi, Ltd., Tokyo, Japan

[21] Appl. No.: 376,216

[22] Filed: Jul. 3, 1989

Related U.S. Application Data

[63] Continuation of Ser. No. 156,745, Feb. 18, 1988, abandoned.

[30] Foreign Application Priority Data

Mar. 6, 1987 [JP] Japan ............................ 62-50032

[51] Int. Cl.$^5$ ........................................... G01R 33/20
[52] U.S. Cl. .................................................. 324/309
[58] Field of Search ............... 324/307, 309, 312, 318, 324/319, 320

[56] References Cited

U.S. PATENT DOCUMENTS 4,720,679  1/1988  Patrick et al. .................. 324/309
4,740,753  4/1988  Glover et al. .................. 324/318

Primary Examiner—Hezron E. Williams
Assistant Examiner—Kevin D. O'Shea
Attorney, Agent, or Firm—Antonelli, Terry, Stout & Kraus

[57] ABSTRACT

In order to narrow the dynamic range of an NMR signal and to provide MRI of low cost and high image quality without inducing the distortions of an image other than distortion of phase which can be corrected or the degradations of the measurement accuracies of various parameters, a coil for generating an inhomogeneous magnetic field which varies slowly within region to-be-imaged is added to a coil for generating a static magnetic field of high homogeneity, and current to flow through the former coil is changed so as to control the inhomogeneous magnetic field.

4 Claims, 2 Drawing Sheets

METHOD AND APPARATUS FOR MRI

This application is a continuation of application Ser. No. 156,745, filed Feb. 18, 1988, now abandoned.

BACKGROUND OF THE INVENTION

The present invention relates to a tomographic imaging apparatus utilizing a magnetic resonance phenomenon, and more particularly to an MRI method and apparatus which are well suited to provide an inexpensive system and to produce a tomographic image of high quality.

In prior-art magnetic resonance imaging apparatuses (hereinbelow, abbreviated to "MRI apparatuses"), great efforts have been expended on enhancing the spatial homogeneity of a static magnetic field, as discussed in a paper entitled "Superconducting Magnet for Magnetic Resonance Imaging," Proceedings of the Japan Institute of Electricity, Vol. 106, No. 10, pp. 23–26 (1986).

Enhancing the homogeneity of a static magnetic field is required in order to reduce various distortions of an obtained image and to raise the measurement accuracies of parameters expressive of the features of a biological tissue, called "$T_1$ and $T_2$ relaxation times."

However, as the homogeneity is enhanced more with the prior art, the maximum amplitude of a nuclear magnetic resonance signal (hereinbelow, abbreviated to "NMR signal") which develops from an object to-be-examined becomes larger, and the dynamic range thereof becomes wider. As a result, the characteristic of an amplifier in the MRI apparatus and a requisite for the bit length of A/D conversion become severe, to give rise to the problems that increase in the cost of the MRI apparatus is incurred and that a quantization error ascribable to an A/D converter degrades the signal-to-noise ratio of an image. These problems become conspicuous especially in case of three-dimensional imaging.

SUMMARY OF THE INVENTION

An object of the present invention is to provide an MRI apparatus and method of low cost and high image quality in such a way that the dynamic range of an NMR signal is narrowed without inducing the distortions of an image other than distortion of phase which can be corrected or degradations in the measurement accuracies of various parameters.

The object is accomplished by disposing, in addition to a coil for generating a static magnetic field of high homogeneity which can be realized by the prior art, a coil for generating an inhomogenous magnetic field which slowly varies within a region to-be-imaged and means for changing current to flow through the inhomogeneous field generating coil, thereby to control the strength of the inhomogeneous field.

Various methods for measuring an NMR signal in an MRI apparatus have been devised. The details are discussed in, for example, "NMR Imaging in Biomedicine" by P. Mansfield et al., Academic Press, 1982. With any of the methods, the NMR signal corresponds to the Fourier components of the spin density distribution $\rho(x, y, z)$ of an element desired to be measured (for example, hydrogen). Here, x, y and z denote three-dimensional coordinates. In an image reconstructing method based on a Fourier transform method, the Fourier components are sampled on rectangular lattices in the spatial frequency domain, and $\rho$ is reconstructed by the inverse Fourier transform. However, the influences of $T_1$ and $T_2$ and the influences of movements are neglected here for simplicity. These effects are comparatively low, and are not essential to the ensuing explanation.

Here, $\rho$ basically takes real and positive value. In general, therefore, the Fourier components thereof have a great peak at 0 (zero)spatial frequency, and the dynamic range of the whole NMR signal is governed by the peak value.

In the present invention, a spatially inhomogeneous magnetic field is applied in the form of a pulse at any desired time between a resonance based on a high-frequency magnetic field and the measurement of the NMR signal, whereby the spin density distribution $\rho$ to be measured is endowed with a spatially changing phase rotation. That is, the following is to be measured:

$$\bar{\rho}(x, y, z) = \rho(x, y, z)\exp\left[i\gamma G'(x, y, z)\int_{T}^{T+\tau} f(t)dt\right] \quad (1)$$

where
- $\rho$: spin density distribution to be measured,
- $\bar{\rho}$: spin density distribution actually measured by endowing a spatially changing phase rotation,
- $i = \sqrt{-1}$: imaginary unit,
- $\gamma$: gyromagnetic ratio ($= 2 \cdot 4.258 \times 10^3$ Hz/G),
- $G'(x, y, z)$: inhomogeneous field strength (G),
- $f(t)$: amplitude of inhomogeneous field,
- $t$: time,
- $T$: start time of inhomogeneous field application,
- $\tau$: time interval of inhomogeneous application.

Besides, assuming that $\gamma\, G'(x, y, z)$ $$\int_{T}^{T+\tau}$$

f(t) dt within [ ] in Eq. (1) changes spatially slowly, that is, in a case where it can be regarded as being constant with the changes of a distance nearly equal to the spatial resolution of an image to-be-obtained, the degradation of the signal-to-noise ratio is not caused by the above operation, and the dynamic range of the NMR signal can be narrowed without incurring the distortions of the image other than the distortion of the phase. Of course, the phase distortion can be corrected on the reconstructed image.

DETAILED DESCRIPTION OF THE PREFERRED EMBODIMENT

Now, an embodiment of the present invention will be described with reference to FIGS. 1–4.

Figure 1:
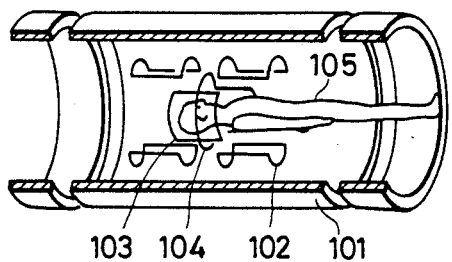
FIG. 1 is a view showing the configuration of various coils in an MRI apparatus.

FIG. 1 is a view showing the relation of arrangement to a subject, of various coils for use in an MRI apparatus embodying the present invention. A static field coil 101 for generating a static magnetic field, a gradient field coil 102 for generating a gradient magnetic field, a coil 103 for generating a high-frequency magnetic field and also for detecting an NMR signal, and a coil 104 for generating an inhomogeneous magnetic field, are arranged relative to a subject 105.

Figure 2:
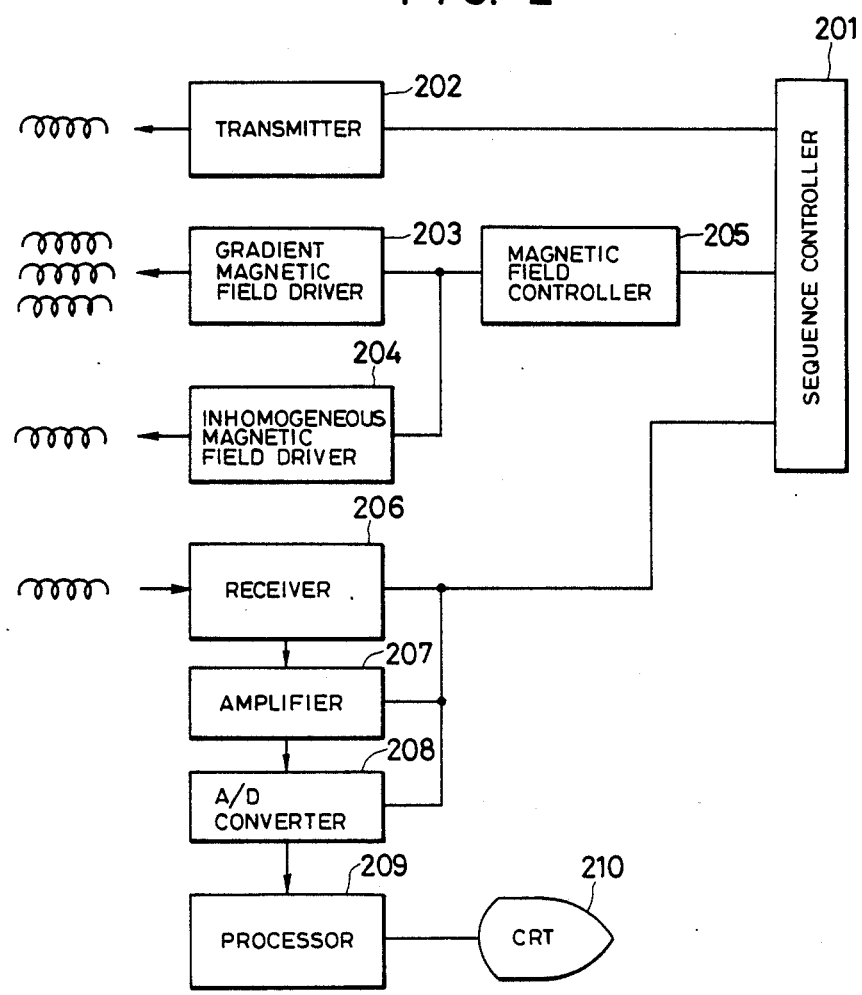
FIG. 2 is a block diagram of the MRI apparatus to which the present invention is applied.

FIG. 2 is a block diagram of the MRI apparatus to which the present invention is applied. In order to detect the NMR signal from the subject 105, the apparatus comprises a sequence controller 201 for controlling various portions of the apparatus in accordance with predetermined steps, a transmitter 202 for high frequency pulses which are generated for causing resonances, a gradient field driver 203 for driving the gradient field coil 102, an inhomogeneous field driver 204 for driving the inhomogeneous field coil 104, a magnetic field controller 205 for controlling both the field drivers, a receiver 206 for receving and detecting the NMR signal produced from the subject, an amplifier 207 for amplifying the detected signal, an A/D converter 208 for digitizing the amplified signal, a processor 209 for subjecting the digital signal to the reconstruction of an image and various calculations, and a CRT display 210 for displaying the image.

Figure 3:
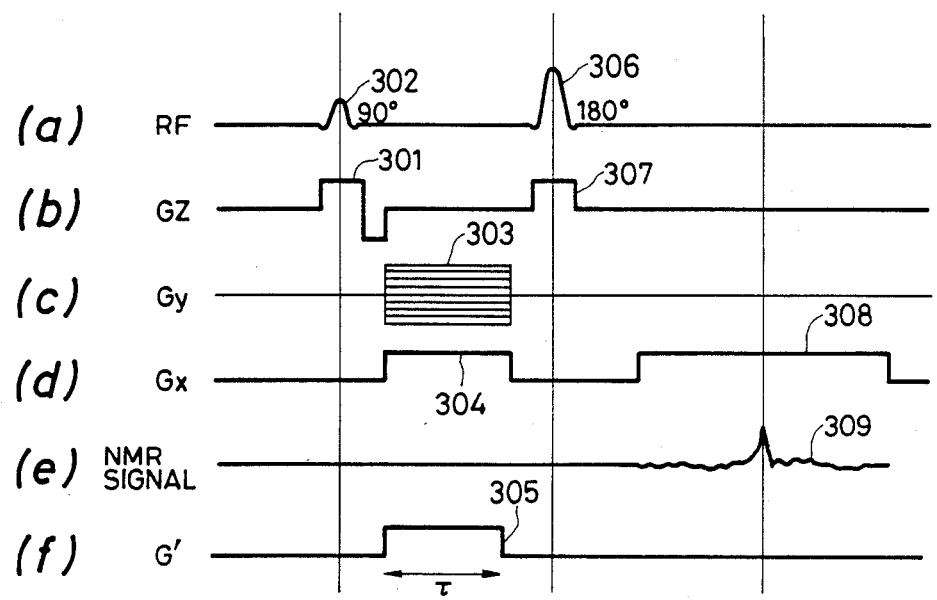
FIG. 3 is a diagram showing an example of a pulse sequence for use in a signal measurement based on the present invention.

The sequence of the present invention in the above construction is illustrated in FIG. 3. First, a 90° high-frequency pulse 302 is generated simultaneously with the application of a gradient field pulse 301 in a z-direction, whereby the spins of a part to be imaged are caused to resonate. Next, a gradient field pulse 303 in a y-direction is applied as a phase encode pulse, while at the same time a dummy gradient field pulse 304 is applied in an x-direction. An inhomogeneous field pulse 305 is also applied for a time interval τ, whereby the spins are endowed with a spatially-changing phase rotation. Subsequently, a 180° high-frequency field pulse 306 for generating a spin echo is applied simultaneously with a z-directional gradient field pulse 307. Thereafter, an NMR signal 309 is measured while a reading gradient field pulse 308 is being applied in the x-direction. The above sequence is repeated as the strength of the y-directional gradient field pulse 303 is being varied.

Since, owing to the steps described above, the two-dimensional Fourier components of the spin density distribution $\bar{\rho}(x, y, z)$ concerning x and y can be measured, $\bar{\rho}$ can be obtained by subjecting all the measured data items to two-dimensional inverse Fourier transform processing. Moreover, since Eq. (1) is rewritten as follows:

$$\bar{\rho}(x, y, z) = \rho(x, y, z)\exp[-i\gamma G'(x, y, z) \int_{T}^{T+\tau} f(t)dt] \quad (2)$$

$\rho$ can be found by correcting the phase with the inhomogeneous field strength $G'(x, y, z)$ measured beforehand.

Figure 4:
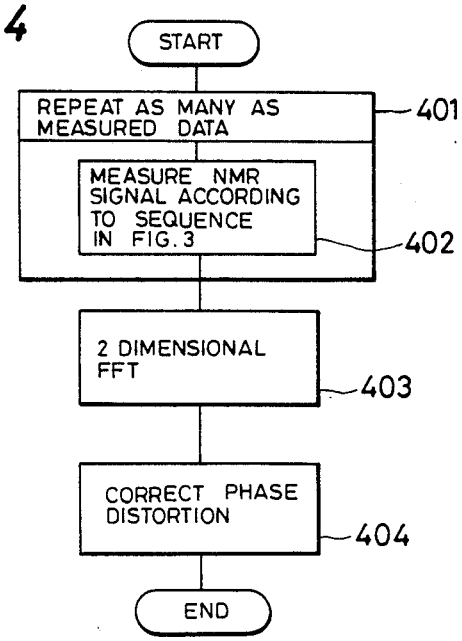
FIG. 4 is a flow chart showing the processing steps of an embodiment of the present invention.

The flow chart of the above processing steps is illustrated in FIG. 4. At a step 401, the signal measurement based on the sequence of FIG. 3 as indicated at a step 402 is repeated in the number of measurement data items. At a step 403, an image is reconstructed by the two-dimensional inverse Fourier transform. At a step 404, the phase correction processing according to Eq. (2) is carried out.

Although, in the foregoing embodiment, the case of employing the spin echo method and the two-dimensional Fourier transform method has been referred to, similar effects are produced even with a three-dimensional Fourier transform method or any other imaging method. Besides, the inhomogeneous magnetic field generating coil 104 has been disposed in the arrangement of FIG. 1. Since, however, a conventional MRI apparatus is furnished with coils for correcting the inhomogeneity of a static magnetic field (coils for shimming), the inhomogeneous magnetic field can also be generated by controlling current which is caused to flow through any one of the coils for shimming. Needless to say, the same effects as in the embodiment are attained in that case.

As set forth above, according to the present invention, the dynamic range of a measurement signal can be narrowed without incurring distortions or the degradation of a signal-to-noise ratio on an image, so that requisites for the characteristic of an amplifier and the bit length of an A/D converter can be mitigated. Another effect is that, since a quantization error can also be made small, an MRI apparatus of high image quality and low cost can be realized.

We claim:

1. A magnetic resonance imaging apparatus comprising means to generate a static magnetic field, a gradient magnetic field and a high-frequency magnetic field; inhomogeneous field generation means to additionally generate a spatially inhomogeneous magnetic field in a region to-be-imaged; means to detect a nuclear magnetic resonance signal from an object to-be-examined; means to convert the detected signal into digital data; and means to subject the digital data to various calculations including reconstruction of an image; wherein said inhomogeneous field generation means includes means to generate a pulsed inhomogeneous magnetic field.

2. A magnetic resonance imaging apparatus comprising means to generate a static magnetic field, a gradient magnetic field and a high-frequency magnetic field; inhomogeneous field generation means to additionally generate a spatially inhomogeneous magnetic field in a region to-be-imaged so as to narrow a dynamic range of a nuclear magnetic resonance signal; means to detect a nuclear magnetic resonance signal from an object to-be-examined; means to convert the detected signal into digital data; and means to subject the digital data to various calculations including reconstruction of an image; wherein said means to subject the digital data to various calculations further includes means to eliminate influences of the inhomogeneous magnetic field on the reconstructed image.

3. A magnetic resonance imaging method comprising the step of generating a static magnetic field, a gradient magnetic field and a high-frequency magnetic field; the step of additionally generating a spatially inhomogeneous magnetic field in a region to-be-imaged; the step of detecting a nuclear magnetic resonance signal from an object to-be-examined; the step of converting the detected signal into digital data; and the step of subjecting the digital data to various calculations including reconstruction of an image; wherein the step of additionally generating the inhomogeneous magnetic field includes generating a pulsed inhomogeneous magnetic field.

4. A magnetic resonance imaging method comprising the step of generating a static magnetic field, a gradient magnetic field and a high-frequency magnetic field; the step of additionally generating a spatially inhomogeneous magnetic field in a region to-be-imaged so as to narrow a dynamic range of a nuclear magnetic resonance signal; the step of detecting a nuclear magnetic resonance signal from an object to-be-examined the step of converting the detected signal into digital data; and the step of subjecting the digital data to various calculations including reconstruction of an image, wherein the step of subjecting the digital data to various calculations further includes eliminating the influences of the inhomogeneous magnetic field on the reconstructed image.

* * * * *